United States Patent [19]

Koors

[11] Patent Number: 4,605,140
[45] Date of Patent: Aug. 12, 1986

[54] TUBE CLOSURE MEMBER HAVING TOGGLE ACTION

[75] Inventor: Mark A. Koors, Kokomo, Ind.

[73] Assignee: General Motors Corporation, Detroit, Mich.

[21] Appl. No.: 773,992

[22] Filed: Sep. 9, 1985

[51] Int. Cl.⁴ .............................................. B65D 53/00
[52] U.S. Cl. ........................ 220/233; 220/DIG. 19; 215/358
[58] Field of Search .............. 220/233, 234, DIG. 19; 217/108, 110; 215/358, 359, 362

[56] References Cited

U.S. PATENT DOCUMENTS

| | | | |
|---|---|---|---|
| 3,033,157 | 5/1962 | Sawyer | 116/137 |
| 4,287,996 | 9/1981 | Wanderer | 220/233 |
| 4,295,578 | 10/1981 | Parent | 220/233 |

*Primary Examiner*—George T. Hall
*Attorney, Agent, or Firm*—Randy M. Tung

[57] ABSTRACT

A toggle-action end plug for a carrier tube used in transporting unmounted semiconductor packages.

2 Claims, 5 Drawing Figures

TUBE CLOSURE MEMBER HAVING TOGGLE ACTION

FIELD OF THE INVENTION

The present invention generally relates to a closure member for an integrated circuit package carrier tube and, more particularly, is concerned with a closure member having manually operated toggle action for an integrated circuit package carrier tube.

BACKGROUND OF THE INVENTION

In the manufacturing of a semiconductive electronic device, the most important element in the device is the integrated circuit chip. An integrated circuit chip is a very fragile and delicate part which can be easily damaged during handling and processing. One of the usual and accepted methods of protecting an integrated circuit chip from damage is to encase an integrated circuit chip inside a thermoset plastic by a molding process. After the encasement process, the body portion of the integrated circuit chip is protected from damage during handling and processing. However, the connecting leads used to connect the integrated circuit chip to other circuitry are still exposed around the periphery of the molded plastic case.

The plastic encased integrated circuit chip which I shall refer to as an integrated circuit package hereon forth is frequently transported in between work stations at a manufacturing plant. To protect the connecting leads from being broken off, being bent or otherwise being damaged during transportation, a plastic container in the shape of a substantially rectangular cross-sectioned tube is conveniently used to store integrated circuit packages. Both ends of the tube are left open when the tube is manufactured to allow insertion or removal of packages from either end. The ends must be plugged by using a closure member to contain the integrated circuit packages. A snug fit between the plug and the inside wall of the plastic tube is important such that integrated circuit packages cannot push the closure member out of the tube end and subsequently fall out of the tube handling and during transportation.

It is therefore an object of the present invention to provide an inexpensive and reliable closure member to enclose to aperture of an integrated circuit package carrier tube.

It is another object of the present invention to provide an inexpensive and reliable closure member for closing the aperture of an integrated circuit package carrier tube which can be inserted and removed with relative ease.

SUMMARY OF THE INVENTION

My novel invention is a closure member used to close the aperture, or opening, of an integrated circuit package carrier tube. This closure member is commonly known as an end plug. It has a central body which is manually operable and surrounded on three sides by a rib member having an U-shape. A plurality of toggles operatively interconnects the central body and the rib member together. The rib member has either a smooth surface or a number of protuberances on the outer peripheral surface to frictionally engage the inside walls of the aperture. An important feature of the invention is the design of the toggle means which permits the central body to move linearly relative to the rib member and simultaneously expanding the rib member. This expansion forces the outer peripheral surface of the rib member to frictionally engage the inside walls of the aperture. The rib member has two built-in stops at the two ends at the U-shaped body to limit the axial movement of the rib member relative to the carrier tube.

During the insertion of the closure member into the aperture of the carrier tube, the initial force required for insertion is low before the rib member is expanded, i.e., before the toggles being pushed from a before-center into an over-center (or locked) position. Once the stops on the rib member engage the end of the carrier tube, containing exerted force on the central body pushes the toggles to pass over their center point into a locked position after a maximum peak force has been achieved. This locking action of the toggles laterally expands the rib member to cause the outer peripheral surface of the rib member to frictionally engage the inside walls of the carrier tube. In the preferred embodiment of my invention, numerous rib-like protuberances are molded on the outer peripheral surface at the rib member. These protuberances further improve the frictional engagement between the rib member and the inside walls of the aperture.

Once the toggles are locked, a maximum peak force is again required to push the toggles to pass over the center point into an unlocked position in order to remove the closure member from the aperture of the tube. This maximum peak force is much higher than the initial insertion force which prevents the closure member being unintentionally pushed out by the weight of the integrated circuit packages when the carrier tube is accidentally tilted or dropped.

DETAILED DESCRIPTION OF A PREFERRED EMBODIMENT

Figure 1:
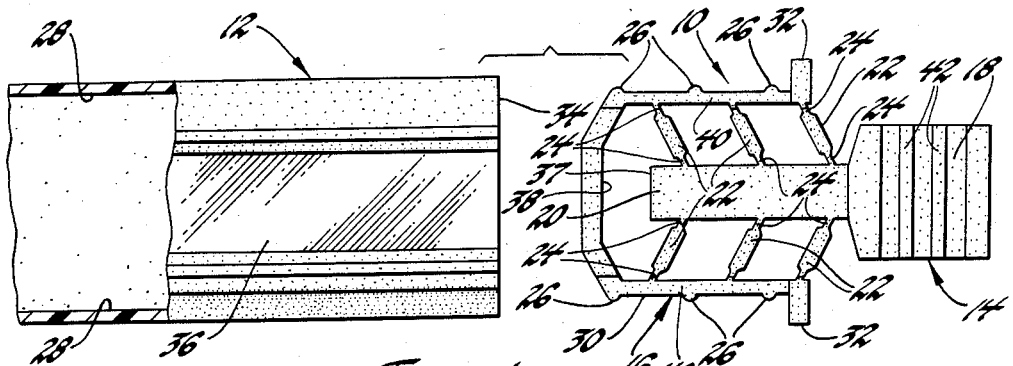
FIG. 1 is a plan view showing a closure member and an end section of a carrier tube prior to insertion.

Referring initially to FIG. 1, a closure member 10 and an end section of a carrier tube 12 is shown in a position prior to insertion. The closure member 10 has a central body 14 which is manually operable and surrounded on three sides by a U-shaped rib member 16. The central body 14 consists of a tab portion 18 and a mandrel portion 20. Six toggles 22 interconnect the mandrel portion 20 and the U-shaped rib member 16 together. The connection is made at the connecting portion 24 of toggle 22 which has reduced cross-sectional area.

In my preferred embodiment, as shown in FIG. 1, the outer peripheral surface of the U-shaped rib member 16 has six rib-like protuberances 26 molded on. These protuberances 26 further improve the frictional engagement between the U-shaped rib member 16 and the inside walls 28 of the end of carrier tube 12. The shape of these protuberances does not have to be rib-like. They can be one of many suitable shapes. As a matter of fact, a smooth outer peripheral surface, without any protuberances on rib member 16, may also serve satisfactorily as an engaging surface. Two built-in stops 32 are molded at the ends of the U-shaped rib member 16 to engage the end portion 34 on the end section of carrier tube 12.

I have used polypropylene material to injection mold the closure member. However, any other suitable material which can withstand a flexing action at the toggles may be suitably used for the closure member. The carrier tube I used in this invention is extruded of a PVC material. A clear window portion 36 is co-extruded into the top of the carrier tube such that the content of the tube can be easily seen.

Figure 2:
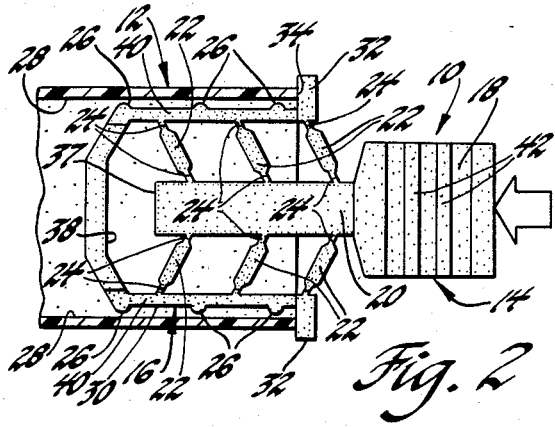
FIG. 2 is a plan view showing the closure member in a fully inserted position inside the end section of the carrier tube prior to the locking of the toggles (toggles are before-center).

FIG. 2 shows the closure member 10 fully inserted into the end section of carrier tube 12 until the stops 32 engage the tube end surface 34. The insertion of the closure member can be done by holding either tab 18 or stops 32. It is important to note that the toggles 22 are still at a before-center position, i.e., the toggles 22 are not locked at this point. Since the toggles 22 are not locked, i.e., the U-shaped rib member 16 is not yet expanded, a gap remains in between the protuberances 26 and the inside wall surface 28 of the carrier tube. Therefore, the closure member 14 can be easily inserted into the end section of carrier tube 12 until the stops 32 engage the tube end surface 34. The insertion force required is very low. Note that before toggles 22 are activated, there is a distance between the end 37 of mandrel 20 and the end portion 38 of U-shaped rib member 16.

Figure 3:
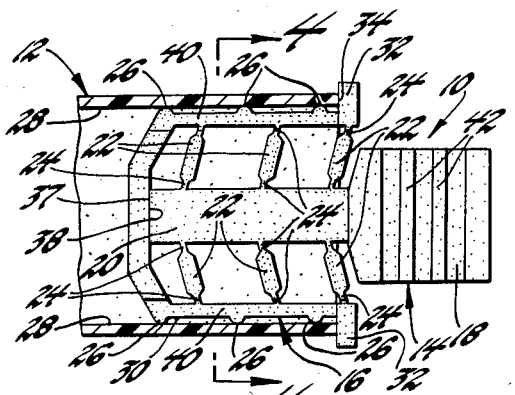
FIG. 3 is a plan view showing the closure member in a fully inserted position inside the end section of the carrier tube after the toggles are locked (toggles are over-center).

In the final stage of the insertion, continuing force acting on tab 18 of the closure member 10 pushes the toggles 22 over-center into a locked position. This is shown in FIG. 3. In this locked position, the end portion 38 of the rib member 16 stops the furtherance of mandrel 20 when the end 37 of the mandrel engages the end portion 38. It is important to note that at this locked position, the two side portions 40 of rib member 16 are being pushed apart by toggles 22 to achieve a close contact at the protuberances 26 against the inside wall 28 of the carrier tube. One important consideration for selecting materials for the closure member is that the material selected must be resilient enough to withstand repeated flexing at the connecting portion 24 of toggle 22 without breaking. It is also important to note that toggles 22 are in an over-center position when they are locked.

Figure 4:
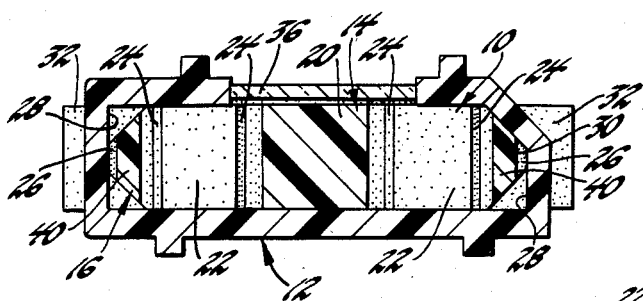
FIG. 4 is a cross-sectional view of a carrier tube having a closure member inserted therein.

FIG. 4 is a cross-sectional view of FIG. 3 showing closure member 10 inside the end section of carrier tube 12 in a locked position. In an alternate embodiment (not shown) where no protuberances are molded on the U-shaped rib member 16, the outer peripheral surface 30 of rib member 16 would directly engage the inside wall surface 28 of the carrier tube 12 for frictional engagement.

Figure 5:
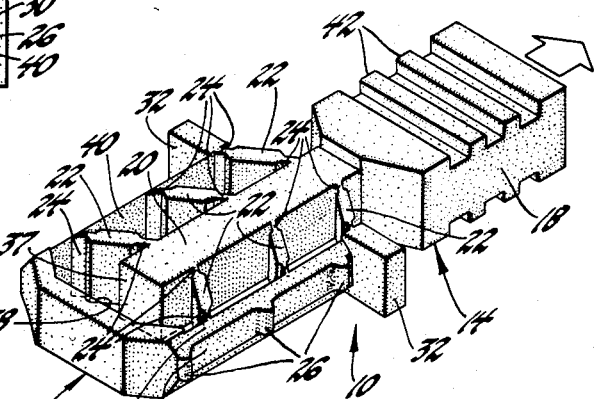
FIG. 5 is a perspective view of a closure member and an end section of a carrier tube after the closure member is removed from the tube.
Figure 5:
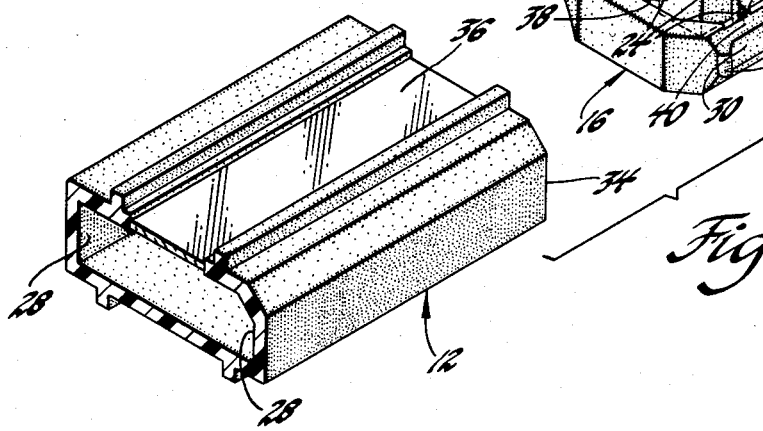

FIG. 5 is a perspective view of closure member 10 and the end section of carrier tube 12 after closure member 10 is removed from the carrier tube. Note that ribs 42 are built into tab 18 for easier gripping of the closure member. It is important to note that during the removal of the closure member from the carrier tube, a maximum peak force is required to first unlock the toggles 22 from an over-center position (FIG. 3) to a before-center (FIG. 2) position. Once the toggles 22 are pulled back into an unlocked position, closure member 10 can be easily removed from the end section of tube 12. It is this maximum peak force required to change the toggles from a locked position to an unlocked position that prevents the closure member from being pushed out accidentally by the weight of the integrated circuit packages stored inside the carrier tube.

It is to be noted that while my preferred embodiment shows the employment of six toggles in the closure member, any suitable number of toggles should work equally well for my invention.

The embodiments of the invention in which an exclusive property or privilege is claimed are defined as follows:

1. A closure member used to close the aperture of an integrated circuit package carrier tube having side walls, said closure member having a central body manually operable surrounded on three sides by a rib member, a plurality of toggle means operatively interconnecting said central body and said rib member, said rib member having a surface on the outer periphery for frictionally engaging the side walls of said aperture, said toggle means being operable permitting said central body to move linearly relative to said rib member simultaneously forcing said protuberances to frictionally engage the side wall surface, said rib member having stop means limiting the axial movement of said rib member, whereby said central body causes said toggle means to laterally expand said rib member achieving the desired closure function.

2. A closure member used to close the aperture of an integrated circuit package carrier tube having side walls, said closure member having a central body manually operable surrounded on three sides by a rib member, a plurality of toggle means operatively interconnecting said central body and said rib member, said rib member having a plurality of protuberances on the outer periphery for frictionally engaging the side walls of said aperture, said toggle means being operable permitting said central body to move linearly relative to said rib member simultaneously forcing said protuberances to frictionally engage the side wall surface, said rib member having stop means limiting the axial movement of said rib member, said rib member having two side portions and an end portion which end portion providing a stop to limit the axial movement of said central body to provide a desired final position of said toggle means, whereby said central body causes said toggle means to laterally expand said rib member to perform the desired closure function.

* * * * *